United States Patent
Doll

(10) Patent No.: US 7,898,799 B2
(45) Date of Patent: Mar. 1, 2011

(54) AIRFLOW MANAGEMENT APPARATUS FOR COMPUTER CABINETS AND ASSOCIATED METHODS

(75) Inventor: Wade J. Doll, Seattle, WA (US)

(73) Assignee: Cray Inc., Seattle, WA (US)

( * ) Notice: Subject to any disclaimer, the term of this patent is extended or adjusted under 35 U.S.C. 154(b) by 0 days.

(21) Appl. No.: 12/060,377

(22) Filed: Apr. 1, 2008

(65) Prior Publication Data

US 2009/0244826 A1    Oct. 1, 2009

(51) Int. Cl.
G06F 1/20    (2006.01)
(52) U.S. Cl. .............. 361/679.48; 361/679.46; 361/695; 454/184; 312/223.2
(58) Field of Classification Search .......... 361/690, 361/679.48, 695, 693, 692, 688, 679.5; 165/121; 454/184; 312/223.2
See application file for complete search history.

(56) References Cited

U.S. PATENT DOCUMENTS

| | | | |
|---|---|---|---|
| 2,628,018 A | 2/1953 | Koch | |
| 2,673,721 A | 3/1954 | Dickinson | |
| 2,861,782 A | 11/1958 | Swartz | |
| 3,120,166 A | 2/1964 | Lyman | |
| 3,192,306 A | 6/1965 | Skonnord | |
| 3,236,296 A | 2/1966 | Dubin | |
| 3,317,798 A | 5/1967 | Chu et al. | |
| 3,348,609 A | 10/1967 | Dubin et al. | |
| 3,525,385 A | 8/1970 | Liebert | |
| 3,559,728 A | 2/1971 | Lyman et al. | |
| 3,648,754 A | 3/1972 | Sephton | |
| 3,903,404 A | 9/1975 | Beall et al. | |
| 3,942,426 A | 3/1976 | Binks et al. | |
| 4,016,357 A | 4/1977 | Abrahamsen | |
| 4,158,875 A | 6/1979 | Tajima et al. | |
| 4,261,519 A | 4/1981 | Ester | |
| 4,270,362 A | 6/1981 | Lancia et al. | |
| 4,271,678 A | 6/1981 | Liebert | |
| 4,306,613 A | 12/1981 | Christopher | |
| 4,313,310 A | 2/1982 | Kobayashi et al. | |
| 4,315,300 A | 2/1982 | Parmerlee et al. | |

(Continued)

FOREIGN PATENT DOCUMENTS

JP    2004-079754    8/2002

(Continued)

OTHER PUBLICATIONS

U.S. Appl. No. 12/253,672, filed Oct. 17, 2008, Doll et al.

(Continued)

*Primary Examiner*—Jayprakash N Gandhi
*Assistant Examiner*—Ingrid Wright
(74) *Attorney, Agent, or Firm*—Perkins Coie LLP

(57) ABSTRACT

Airflow management apparatuses for computer cabinets and associated methods are disclosed herein. The computer cabinets include a plurality of computer modules positioned between an air inlet and an air outlet and an air mover configured to move a flow of cooling air from the air inlet, past the plurality of computer modules, and out the computer cabinet via the air outlet. The computer cabinets carry an airflow restrictor positioned proximate to the air outlet. The airflow restrictor is configured to restrict the flow of cooling air through a portion of the computer cabinet to achieve a desired temperature profile in the computer cabinet.

16 Claims, 5 Drawing Sheets

U.S. PATENT DOCUMENTS

| | | |
|---|---|---|
| 4,386,651 A | 6/1983 | Reinhard |
| 4,449,579 A | 5/1984 | Miyazaki et al. |
| 4,458,296 A | 7/1984 | Bryant et al. |
| 4,473,382 A | 9/1984 | Cheslock |
| 4,513,351 A | 4/1985 | Davis et al. |
| 4,528,614 A | 7/1985 | Shariff et al. |
| 4,535,386 A | 8/1985 | Frey, Jr. et al. |
| 4,642,715 A | 2/1987 | Ende |
| 4,644,443 A | 2/1987 | Swensen et al. |
| 4,691,274 A | 9/1987 | Matouk et al. |
| 4,702,154 A | 10/1987 | Dodson |
| 4,728,160 A | 3/1988 | Mondor et al. |
| 4,767,262 A | 8/1988 | Simon |
| 4,774,631 A | 9/1988 | Okuyama et al. |
| 4,797,783 A | 1/1989 | Kohmoto et al. |
| 4,798,238 A | 1/1989 | Ghiraldi |
| 4,860,163 A | 8/1989 | Sarath |
| 4,874,127 A | 10/1989 | Collier |
| 4,901,200 A | 2/1990 | Mazura |
| 4,911,231 A | 3/1990 | Horne et al. |
| 4,993,482 A | 2/1991 | Dolbear et al. |
| 5,000,079 A | 3/1991 | Mardis |
| 5,019,880 A | 5/1991 | Higgins, III |
| 5,035,628 A | 7/1991 | Casciotti et al. |
| 5,060,716 A | 10/1991 | Heine |
| 5,090,476 A | 2/1992 | Immel |
| 5,101,320 A | 3/1992 | Bhargava et al. |
| 5,131,233 A | 7/1992 | Cray et al. |
| 5,150,277 A | 9/1992 | Bainbridge et al. |
| 5,161,087 A | 11/1992 | Frankeny et al. |
| 5,165,466 A | 11/1992 | Arbabian |
| 5,196,989 A | 3/1993 | Zsolnay |
| 5,263,538 A | 11/1993 | Amidieu et al. |
| 5,273,438 A | 12/1993 | Bradley |
| 5,297,990 A | 3/1994 | Renz et al. |
| 5,323,847 A | 6/1994 | Koizumi et al. |
| 5,326,317 A | 7/1994 | Ishizu et al. |
| 5,329,425 A | 7/1994 | Leyssens et al. |
| 5,339,214 A | 8/1994 | Nelson |
| 5,345,779 A | 9/1994 | Feeney |
| 5,365,402 A | 11/1994 | Hatada et al. |
| 5,376,008 A | 12/1994 | Rodriguez |
| 5,395,251 A | 3/1995 | Rodriguez et al. |
| 5,402,313 A | 3/1995 | Casperson et al. |
| 5,410,448 A | 4/1995 | Barker, III et al. |
| 5,414,591 A | 5/1995 | Kimura et al. |
| 5,467,250 A | 11/1995 | Howard et al. |
| 5,467,609 A | 11/1995 | Feeney |
| 5,471,850 A | 12/1995 | Cowans |
| 5,491,310 A | 2/1996 | Jen |
| 5,493,474 A | 2/1996 | Schkrohowsky et al. |
| 5,547,272 A | 8/1996 | Paterson et al. |
| 5,572,403 A | 11/1996 | Mills |
| 5,603,375 A | 2/1997 | Salt |
| 5,684,671 A | 11/1997 | Hobbs et al. |
| 5,685,363 A | 11/1997 | Orihira et al. |
| 5,707,205 A | 1/1998 | Otsuka |
| 5,709,100 A | 1/1998 | Baer et al. |
| 5,718,628 A | 2/1998 | Nakazato et al. |
| 5,749,702 A | 5/1998 | Datta et al. |
| 5,782,546 A | 7/1998 | Iwatare |
| 5,793,610 A | 8/1998 | Schmitt et al. |
| 5,829,676 A | 11/1998 | Ban et al. |
| 5,880,931 A | 3/1999 | Tilton et al. |
| 5,927,386 A | 7/1999 | Lin |
| 5,979,541 A | 11/1999 | Saito |
| 6,021,047 A | 2/2000 | Lopez et al. |
| 6,026,565 A | 2/2000 | Giannatto et al. |
| 6,034,870 A * | 3/2000 | Osborn et al. ............... 361/690 |
| 6,039,414 A | 3/2000 | Melane et al. |
| 6,046,908 A | 4/2000 | Feng |
| 6,052,278 A | 4/2000 | Tanzer et al. |
| 6,061,237 A | 5/2000 | Sands et al. |
| 6,104,608 A | 8/2000 | Casinelli et al. |
| 6,115,242 A | 9/2000 | Lambrecht |
| 6,132,171 A | 10/2000 | Fujinaka et al. |
| 6,135,875 A | 10/2000 | French |
| 6,158,502 A | 12/2000 | Thomas |
| 6,164,369 A | 12/2000 | Stoller |
| 6,167,948 B1 | 1/2001 | Thomas |
| 6,182,787 B1 | 2/2001 | Kraft et al. |
| 6,183,196 B1 | 2/2001 | Fujinaka |
| 6,185,098 B1 | 2/2001 | Benavides |
| 6,205,796 B1 | 3/2001 | Chu et al. |
| 6,208,510 B1 | 3/2001 | Trudeau et al. |
| 6,236,564 B1 | 5/2001 | Fan |
| 6,272,012 B1 | 8/2001 | Medin et al. |
| 6,305,180 B1 | 10/2001 | Miller et al. |
| 6,310,773 B1 | 10/2001 | Yusuf et al. |
| 6,332,946 B1 | 12/2001 | Emmett et al. |
| 6,351,381 B1 | 2/2002 | Bilski et al. |
| 6,359,779 B1 | 3/2002 | Frank, Jr. et al. |
| 6,361,892 B1 | 3/2002 | Ruhl et al. |
| 6,396,684 B2 | 5/2002 | Lee |
| 6,416,330 B1 | 7/2002 | Yatskov |
| 6,435,266 B1 | 8/2002 | Wu |
| 6,439,340 B1 | 8/2002 | Shirvan |
| 6,462,944 B1 | 10/2002 | Lin |
| 6,481,527 B1 | 11/2002 | French et al. |
| 6,501,652 B2 | 12/2002 | Katsui |
| 6,515,862 B1 | 2/2003 | Wong et al. |
| 6,519,955 B2 | 2/2003 | Marsala |
| 6,524,064 B2 | 2/2003 | Chou et al. |
| 6,542,362 B2 | 4/2003 | Lajara et al. |
| 6,546,998 B2 | 4/2003 | Oh et al. |
| 6,550,530 B1 | 4/2003 | Bilski |
| 6,554,697 B1 | 4/2003 | Koplin |
| 6,557,357 B2 | 5/2003 | Spinazzola et al. |
| 6,557,624 B1 | 5/2003 | Stahl et al. |
| 6,564,571 B2 | 5/2003 | Feeney |
| 6,564,858 B1 | 5/2003 | Stahl |
| 6,582,192 B2 | 6/2003 | Tseng |
| 6,587,340 B2 | 7/2003 | Grouell et al. |
| 6,609,592 B2 | 8/2003 | Wilson |
| 6,628,520 B2 | 9/2003 | Patel et al. |
| 6,631,078 B2 | 10/2003 | Alcoe |
| 6,644,384 B2 | 11/2003 | Stahl |
| 6,661,660 B2 | 12/2003 | Prasher et al. |
| 6,679,081 B2 | 1/2004 | Marsala |
| 6,684,457 B2 | 2/2004 | Holt |
| 6,690,576 B2 | 2/2004 | Clements et al. |
| 6,705,625 B2 | 3/2004 | Holt et al. |
| 6,714,412 B1 | 3/2004 | Chu et al. |
| 6,724,617 B2 | 4/2004 | Amaike et al. |
| 6,742,068 B2 | 5/2004 | Gallagher et al. |
| 6,745,579 B2 | 6/2004 | Spinazzola et al. |
| 6,755,280 B2 | 6/2004 | Porte et al. |
| 6,761,212 B2 | 7/2004 | DiPaolo |
| 6,772,604 B2 | 8/2004 | Bash et al. |
| 6,775,137 B2 | 8/2004 | Chu et al. |
| 6,776,707 B2 | 8/2004 | Koplin |
| 6,796,372 B2 | 9/2004 | Bear |
| 6,801,428 B2 | 10/2004 | Smith et al. |
| 6,819,563 B1 | 11/2004 | Chu et al. |
| 6,836,407 B2 | 12/2004 | Faneuf et al. |
| 6,854,287 B2 | 2/2005 | Patel et al. |
| 6,854,659 B2 | 2/2005 | Stahl et al. |
| 6,860,713 B2 | 3/2005 | Hoover |
| 6,867,966 B2 | 3/2005 | Smith et al. |
| 6,875,101 B1 | 4/2005 | Chien |
| 6,876,549 B2 | 4/2005 | Beitelmal et al. |
| 6,881,898 B2 | 4/2005 | Baker et al. |
| 6,882,531 B2 | 4/2005 | Modica |
| 6,904,968 B2 | 6/2005 | Beitelmal et al. |

| | | |
|---|---|---|
| 6,909,611 B2 | 6/2005 | Smith et al. |
| 6,914,780 B1 | 7/2005 | Shanker et al. |
| 6,932,443 B1 | 8/2005 | Kaplan et al. |
| 6,975,510 B1 | 12/2005 | Robbins et al. |
| 6,992,889 B1 | 1/2006 | Kashiwagi et al. |
| 6,997,245 B2 | 2/2006 | Lindermuth et al. |
| 6,997,741 B2 | 2/2006 | Doll |
| 6,999,316 B2 | 2/2006 | Hamman |
| 7,016,191 B2 | 3/2006 | Miyamoto et al. |
| 7,051,802 B2 | 5/2006 | Baer |
| 7,051,946 B2 | 5/2006 | Bash et al. |
| 7,059,899 B2 | 6/2006 | Doll |
| 7,120,017 B2 | 10/2006 | Shieh |
| 7,120,027 B2 | 10/2006 | Yatskov et al. |
| 7,123,477 B2 | 10/2006 | Coglitore et al. |
| 7,144,320 B2 | 12/2006 | Turek et al. |
| 7,152,418 B2 * | 12/2006 | Alappat et al. ................. 62/186 |
| 7,154,748 B2 * | 12/2006 | Yamada ....................... 361/690 |
| 7,177,156 B2 | 2/2007 | Yatskov et al. |
| 7,182,208 B2 | 2/2007 | Tachibana |
| 7,187,549 B2 | 3/2007 | Teneketges et al. |
| 7,193,846 B1 | 3/2007 | Davis et al. |
| 7,193,851 B2 | 3/2007 | Yatskov et al. |
| 7,209,351 B2 | 4/2007 | Wei |
| 7,215,552 B2 | 5/2007 | Shipley et al. |
| 7,218,516 B2 | 5/2007 | Yu et al. |
| 7,226,353 B2 | 6/2007 | Bettridge et al. |
| 7,242,579 B2 | 7/2007 | Fernandez et al. |
| 7,255,640 B2 | 8/2007 | Aldag et al. |
| 7,259,963 B2 | 8/2007 | Germagian et al. |
| 7,286,351 B2 | 10/2007 | Campbell et al. |
| 7,304,842 B2 | 12/2007 | Yatskov et al. |
| 7,314,113 B2 | 1/2008 | Doll |
| 7,315,448 B1 | 1/2008 | Bash et al. |
| 7,330,350 B2 | 2/2008 | Hellregel |
| 7,362,571 B2 | 4/2008 | Kelley et al. |
| 7,385,810 B2 | 6/2008 | Chu et al. |
| 7,397,661 B2 | 7/2008 | Campbell et al. |
| 7,411,785 B2 | 8/2008 | Doll |
| 7,418,825 B1 | 9/2008 | Bean, Jr. |
| 7,420,805 B2 | 9/2008 | Smith et al. |
| 7,430,118 B1 | 9/2008 | Noteboom et al. |
| 7,513,923 B1 | 4/2009 | Lewis et al. |
| 7,542,287 B2 | 6/2009 | Lewis, II et al. |
| 7,554,803 B2 | 6/2009 | Artman et al. |
| 2001/0052412 A1 | 12/2001 | Tikka |
| 2002/0072809 A1 | 6/2002 | Zuraw |
| 2002/0172007 A1 | 11/2002 | Pautsch |
| 2002/0181200 A1 | 12/2002 | Chang |
| 2003/0010477 A1 | 1/2003 | Khrustalev et al. |
| 2003/0056941 A1 | 3/2003 | Lai et al. |
| 2003/0161102 A1 | 8/2003 | Lee et al. |
| 2003/0183446 A1 | 10/2003 | Shah et al. |
| 2004/0008491 A1 | 1/2004 | Chen |
| 2004/0020225 A1 | 2/2004 | Patel et al. |
| 2004/0033135 A1 | 2/2004 | Chang |
| 2004/0052052 A1 | 3/2004 | Rivera |
| 2004/0250990 A1 | 12/2004 | Schaper |
| 2005/0120737 A1 | 6/2005 | Borror et al. |
| 2005/0161205 A1 | 7/2005 | Ashe et al. |
| 2005/0162834 A1 | 7/2005 | Nishimura |
| 2005/0168945 A1 | 8/2005 | Coglitore |
| 2005/0186070 A1 | 8/2005 | Zeng et al. |
| 2005/0207116 A1 | 9/2005 | Yatskov |
| 2005/0225936 A1 | 10/2005 | Day |
| 2005/0241810 A1 | 11/2005 | Malone et al. |
| 2006/0018094 A1 | 1/2006 | Robbins et al. |
| 2006/0044758 A1 | 3/2006 | Spangberg |
| 2006/0102322 A1 | 5/2006 | Madara |
| 2006/0180301 A1 | 8/2006 | Baer |
| 2007/0030650 A1 | 2/2007 | Madara et al. |
| 2007/0211428 A1 | 9/2007 | Doll |
| 2008/0018212 A1 | 1/2008 | Spearing et al. |
| 2008/0078202 A1 | 4/2008 | Luo |
| 2008/0092387 A1 | 4/2008 | Campbell et al. |
| 2008/0098763 A1 | 5/2008 | Yamaoka |
| 2008/0158814 A1 | 7/2008 | Hattori |
| 2008/0174953 A1 * | 7/2008 | Fuke et al. .................. 361/687 |
| 2008/0216493 A1 | 9/2008 | Lin et al. |

FOREIGN PATENT DOCUMENTS

| | | |
|---|---|---|
| WO | WO 01/86217 | 11/2001 |
| WO | WO 2005/027609 | 3/2005 |

OTHER PUBLICATIONS

U.S. Appl. No. 12/253,692, filed Oct. 17, 2008, Doll et al.
Non-Final Office Action for U.S. Appl. No. 11/371,272, Mail Date Mar. 19, 2009, 13 pages.
U.S. Appl. No. 11/958,114, filed Dec. 17, 2007, Yatskov.
U.S. Appl. No. 12/029,124, filed Feb. 11, 2008, Kelley et al.
Baer, D. B., "Emerging Cooling Requirements & Systems in Telecommunications Spaces," Telecommunications Energy Conference 2001, Oct. 14-18, 2001, pp. 95-100.
Bleier, F. P., "FAN Handbook, Selection, Application, and Design," McGraw Hill, 1998, pp. 7.50-7.51.
"Frequently Asked Questions about Heat Pipes," Thermacore International, Inc., http://www.thermacore.com/hpt_faqs.htm, 3 pages [accessed Jun. 14, 2004].
Hannemann, R. et al., "Pumped Liquid Multiphase Cooling," ASME, 2004, IMECE 2004, Paper IMECE2004-60669, Anaheim, CA, 5 pages.
Novel Concepts, Inc., "Heat Spreaders," http://www.novelconceptsinc.com/heat-spreaders.htm, 2 pages [accessed Jun. 14, 2004].
JAMSTEC/Earth Simulator Center, "Processor Node (PN) Cabinet," http://www.es.jamstec.go.jp/esc/eng/Hardware/pnc.html, 1 page [accessed Mar. 5, 2004].
"Managing Extreme Heat Cooling Strategies for High-Density Computer Systems," Liebert Corporation, Dec. 7, 2003, Columbus, OH, 16 pages.
Marsala, J., "Pumped Liquid/Two Phase Cooling for High Performance Systems," Thermal Form & Function LLC, May 13, 2003, Scottsdale, AZ, 19 pages.
Pitasi, M. "Thermal Management System Using Pumped Liquid R-134a with Two Phase Heat Transfer," Thermal Form & Function LLC, Manchester, MA, Mar. 2002, pp. 1-9, http:/www.coolingzone.com/Guest/News/NL_MAR_2002/TFF/Tff.html.
"Therma-base-Heat Sink," Thermacore Thermal Management Solutions, pp. 1-3, [accessed Jun. 14, 2005].
Thermal Form & Function LLC, "Box/Blade Cooling System," http://www.thermalformandfunction.com/boxsystem.html, Manchester, MA, 2005, 1 page [accessed May 10, 2006].
"Thermal Form & Function—Rack Cooling System (RCS)," Thermal Form & Function LLC, 2005, Manchester, MA, one page, http:/www.thermalformandfunction.com/racksystem.html, [accessed May 11, 2006].
Vogel, M. et al., "Low Profile Heat Sink Cooling Technologies for Next Generation CPU Thermal Designs," Electronic Cooling Online, Feb. 17, 2005, 11 pages.
Webb, W., "Take the heat: Cool that hot embedded design," EDN, May 13, 2004, 5 pages.
Non-Final Office Action for U.S. Appl. No. 11/958,114, Mail Date Aug. 25, 2009, 22 pages.
U.S. Appl. No. 12/763,977, filed Apr. 20, 2010, Doll.

* cited by examiner

AIRFLOW MANAGEMENT APPARATUS FOR COMPUTER CABINETS AND ASSOCIATED METHODS

TECHNICAL FIELD

The following disclosure relates generally to computer air conditioning systems and, more particularly, to airflow management apparatus and associated methods for use with such air conditioning systems.

BACKGROUND

Supercomputers and other large computer systems typically include a large number of computer cabinets arranged in close proximity to one another. FIG. 1, for example, illustrates a portion of a prior art supercomputer system 100 having a plurality of computer cabinets 110 arranged in a bank. The computer cabinets 110 are arranged in a bank to conserve floor space and increase computational speed by reducing cable lengths between cabinets. Each of the computer cabinets 110 includes a plurality of computer module compartments 118 (identified individually as a first module compartment 118a, a second module compartment 118b, and a third module compartment 118c). Each module compartment 118 holds a plurality of computer modules 112. Like the computer cabinets 110, the computer modules 112 are also positioned in close proximity to one another to conserve space and increase computational speed. Each of the computer modules 112 can include a motherboard electrically connecting a plurality of processors, memory modules, routers, and other microelectronic devices together for data and/or power transmission.

Many of the electronic devices typically found in supercomputers, such as fast processing devices, generate considerable heat during operation. This heat can damage the device and/or degrade performance if not dissipated during operation. Consequently, supercomputers typically include both active and passive cooling systems to maintain device temperatures at acceptable levels.

To dissipate heat generated by the computer modules 112, the prior art supercomputer system 100 further includes a plurality of fans 120 mounted to upper portions of corresponding computer cabinets 110. In operation, each of the fans 120 draws cooling air into the corresponding computer cabinet 110 through a front inlet 114 and/or a back inlet 115 positioned toward a bottom portion of the computer cabinet 110. The cooling air flows upwardly through the computer cabinet 110, past the computer modules 112, and into a central inlet 122 of the fans 120. The fans 120 then exhaust the cooling air outward in a radial pattern through a circumferential outlet 124.

The fans 120 may be unable to move a sufficient amount of air through the computer cabinet 110 for adequate cooling when the power consumption and the corresponding heat dissipation increase in the processors and/or other microelectronic devices carried by the computer modules 112. For example, as the power consumption of the processors increases, the computer modules 112 in the first module compartment 118a heat the incoming cooling air to a higher temperature. To compensate for the higher temperature of the cooling air entering the second module compartment 118b, conventional techniques use baffle plates (not shown) to direct more cooling air over the processors. This, however, can increase the pressure drop over the processors, for which the fans 120 may be unable to compensate. As a result, the cooling air flowing past the processors may be insufficient and cause overheating of the processors, and thus adversely affect performance of the computer system 100.

DETAILED DESCRIPTION

The following disclosure describes several embodiments of airflow management systems and associated methods for use with computers and other systems. Other embodiments of the invention can have different configurations, components, or procedures than those described below. A person of ordinary skill in the art, therefore, will accordingly understand that the invention can have other embodiments with additional elements, or the invention can have other embodiments without several of the features shown and described below with reference to FIGS. 2-5.

In the Figures, identical reference numbers identify identical or at least generally similar elements. To facilitate the discussion of any particular element, the most significant digit or digits of any reference number refer to the Figure in which that element is first introduced. Element 202, for example, is first introduced and discussed with reference to FIG. 2.

Figure 1:
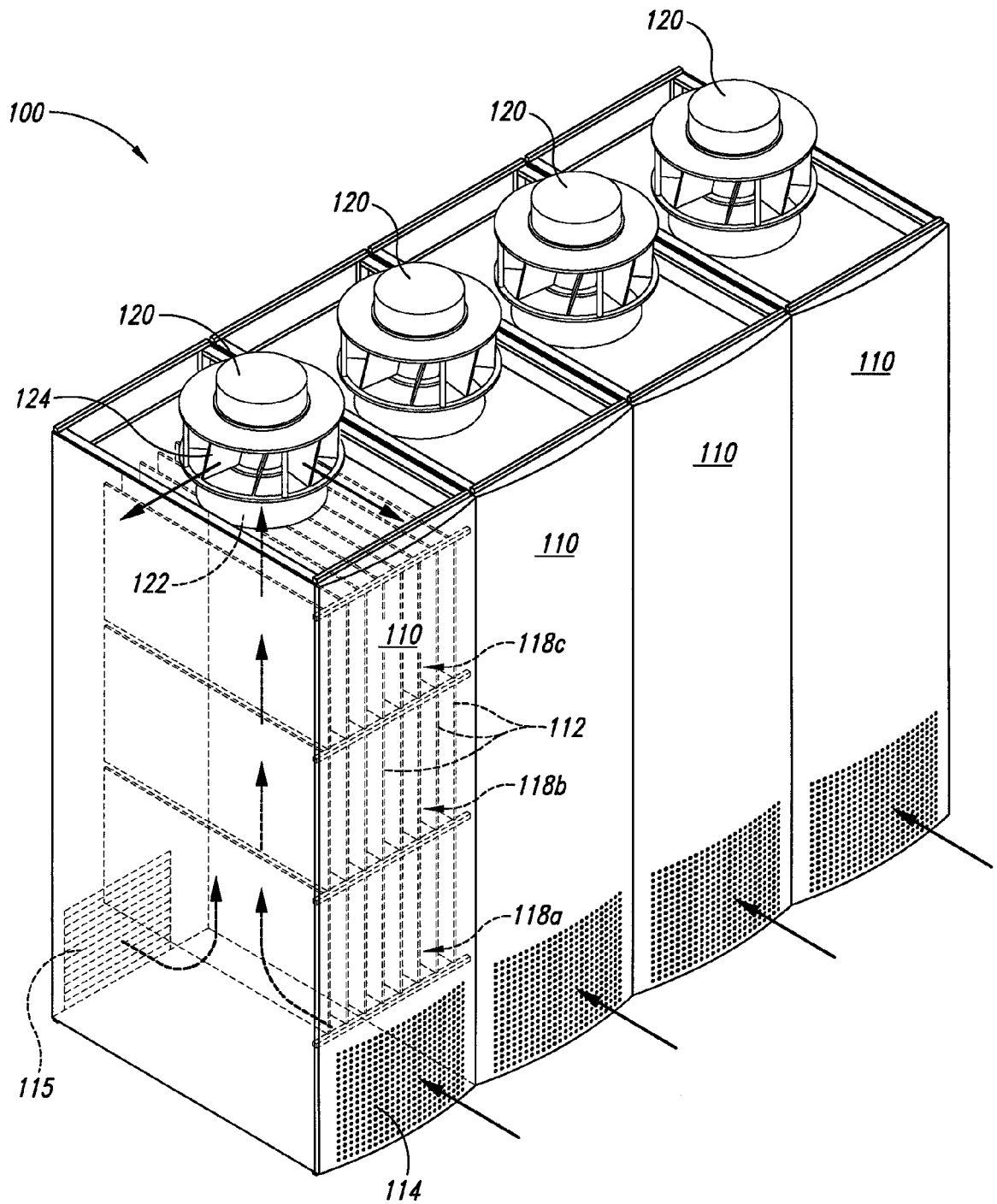
FIG. 1 is an isometric view of a bank of computer cabinets having top-mounted cooling fans in accordance with the prior art.
Figure 2:
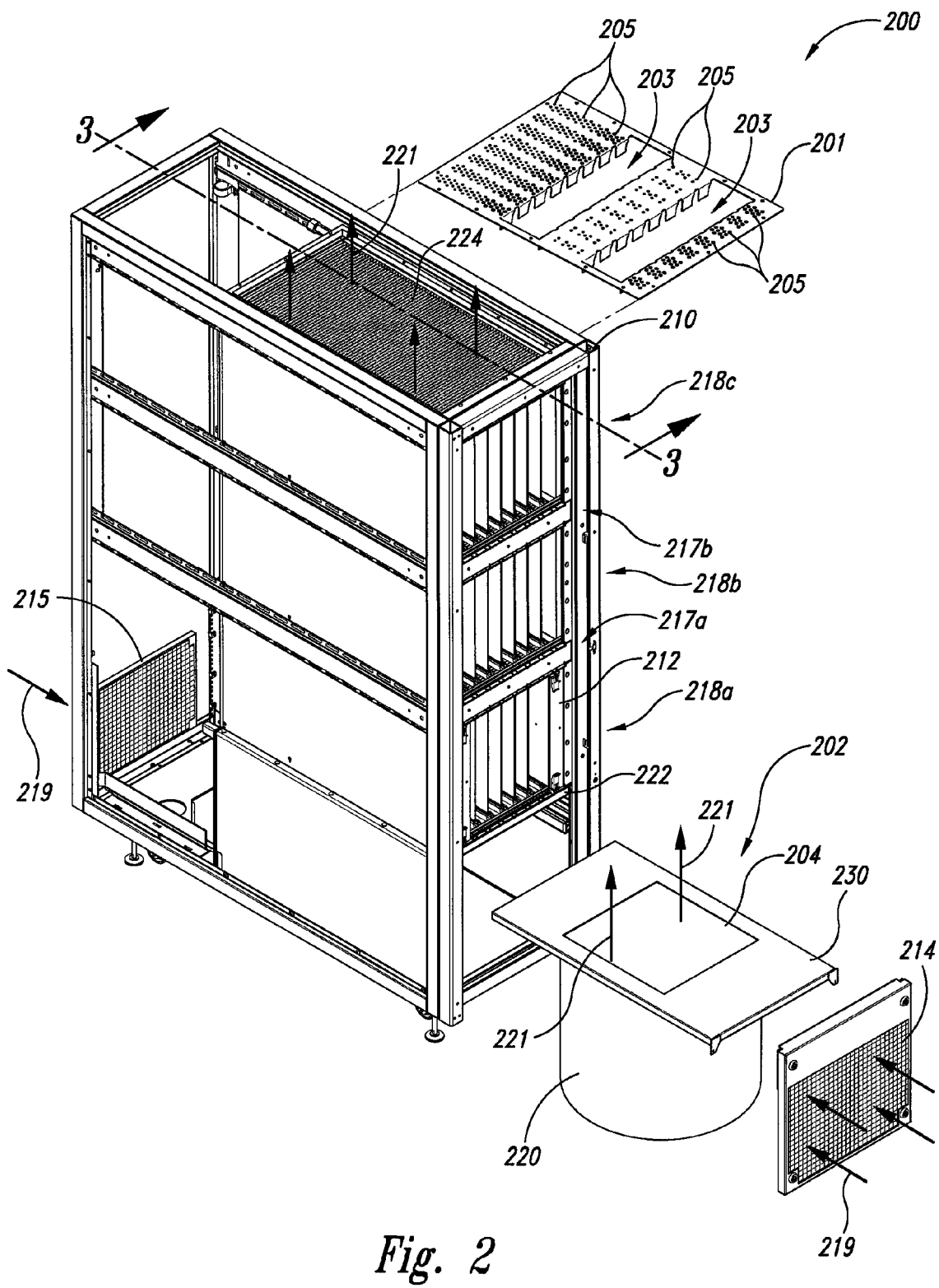
FIG. 2 is a partially exploded isometric view of a computer cabinet that carries an airflow restrictor configured in accordance with an embodiment of the invention.

FIG. 2 is a partially exploded isometric view of a computer cabinet 210 that carries an airflow restrictor 200 configured in accordance with an embodiment of the invention. In the illustrated embodiment, some external panels of the computer cabinet 210 have been removed for clarity. Many features of the computer cabinet 210 can be at least generally similar in structure and function to corresponding features of the computer cabinet 110 described above with reference to FIG. 1. For example, the computer cabinet 210 can include a plurality of computer module compartments 218 (identified individually as first, second, and third module compartments 218a-c, respectively) positioned between a front air inlet 214 and a back air inlet 215 positioned toward a bottom portion of the computer cabinet 210, and an air outlet 224 positioned toward a top portion of the computer cabinet 210. A plurality of inter-compartmental gaps 217 (identified individually as a first gap 217a and a second gap 217b) separate the adjacent module compartments 218. The module compartments 218 individually hold a plurality of computer modules 212 in vertical, edgewise orientations. Each computer module 212 can include a motherboard carrying a plurality of processors, memory modules, routers, and other microelectronic devices individually covered with a shroud (not shown) to form separate airflow passageways extending vertically through the computer cabinet 210.

The computer cabinet 210 can also include an air mover assembly 202 positioned toward the bottom portion of the computer cabinet 210 to drive cooling air through the computer cabinet 210. The air mover assembly 202 can include an air mover 220 attached to a mounting plate 230 that includes a plate opening 204 positioned proximate to the air mover 220. In one embodiment, the air mover 220 can include a vane-axial blower (not shown). In other embodiments, the air mover 220 can include a centrifugal fan, an axial fan, and/or other types of suitable air moving devices known in the art.

Figure 5:
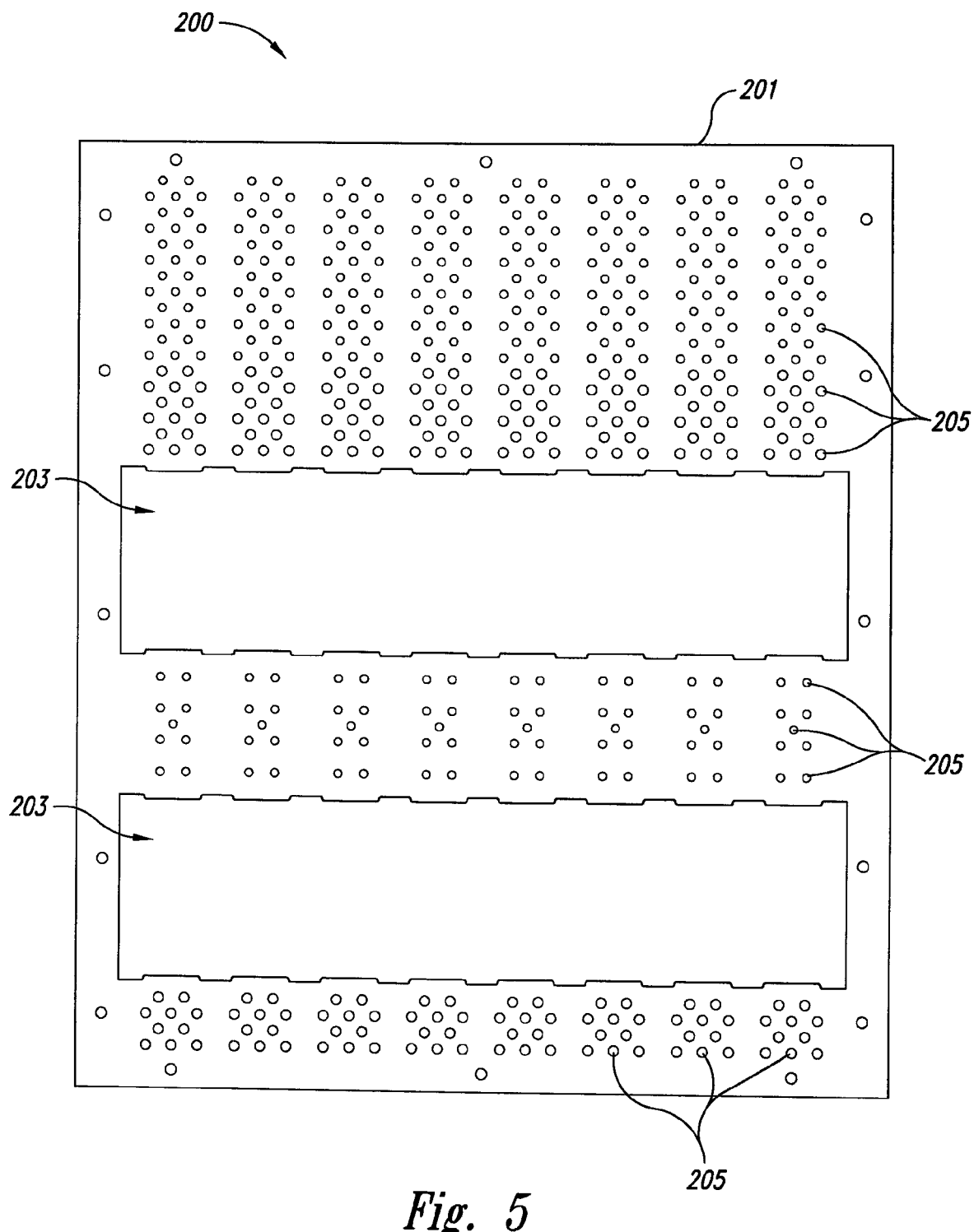
FIG. 5 is a plan view of the airflow restrictor of FIG. 3 configured in accordance with an embodiment of the invention.

The airflow restrictor 200 is positioned proximate to the air outlet 224 on the computer cabinet 210. The airflow restrictor 200 can include a substrate 201 (e.g., a plate, a sheet, and/or other suitable substrate structure) having one or more open portions 203 (two are shown for illustration purposes) proximate to a plurality of restricted portions 205. An enlarged plan view of the airflow restrictor 200 is illustrated in FIG. 5. Referring to FIG. 2 and FIG. 5 together, in the illustrated embodiment, the restricted portions 205 include a plurality of through holes or apertures arranged in arrays in the substrate 201. In other embodiments, the restricted portions 205 can also include channels, slots, ventures, and/or other suitable flow modifying devices. In further embodiments, the airflow restrictor 200 can also include vanes, grills, baffle plates, and/or other suitable structures in the open portions 203 for, e.g., modifying a flow pattern of the cooling air.

As described in greater detail below, the open portions 203 are generally aligned with passageways through the computer cabinet 210 in which processors and/or other high-power microelectronic devices are located. Conversely, the restricted portions 205 are generally aligned with other passageways in which memory modules, network interface modules, and/or other low-power microelectronic devices are located. As used hereinafter, the phrases "high-power" and "low-power" are generally relative terms. For example, a memory module may be considered a high-power device because its power consumption is higher than, e.g., a network interface module, but a low-power device because its power consumption is lower than, e.g., a processor. As a result, the memory module may be a high-power microelectronic device in one arrangement, but a low-power microelectronic device in a different arrangement.

The computer cabinet 210 can optionally include one or more sensors (not shown) for monitoring operating conditions of the computer modules 212. For example, the computer cabinet 210 can include one or more temperature sensors (e.g., thermocouples, resistive temperature detectors, infrared temperature monitors, etc.), flow sensors (e.g., flow switches and flow transmitters), pressure sensors (e.g., pressure switches, pressure transmitters, etc.), and/or other types of sensors capable of measuring parameters indicative of operating conditions of the computer modules 212. For instance, the computer cabinet 210 can include thermocouples (not shown) positioned in each module compartment 218 to monitor operating temperatures inside the computer cabinet 210. In another embodiment, the computer cabinet 210 can include a flow transmitter (not shown) positioned toward the top portion of the computer cabinet 210 to measure the flow rate of cooling air through the top portion.

In operation, the air mover assembly 202 draws cooling air (represented by arrows 219) into the computer cabinet 210 via the front air inlet 214 and the back inlet 215. The air mover 220 compresses the cooling air and drives the compressed cooling air upwardly through the plate opening 204 (represented by arrows 221). The cooling air then flows past the computer modules 212 in the module compartments 218 and absorbs heat generated by the computer modules 212 during operation. The heated cooling air then flows through the airflow restrictor 200 before exiting the computer cabinet 210 through the outlet 224. During operation, one or more of the optional sensors described above can monitor the operating conditions of the computer modules 212. The airflow restrictor 200 modifies the flow pattern of cooling air flowing through individual passageways in the computer cabinet 210. As a result, the airflow restrictor 200 can improve temperature profiles in the computer cabinet 210 without significantly increasing the pressure drop of the cooling air flowing through the computer cabinet 210, as described in more detail below with reference to FIG. 3.

Figure 3:
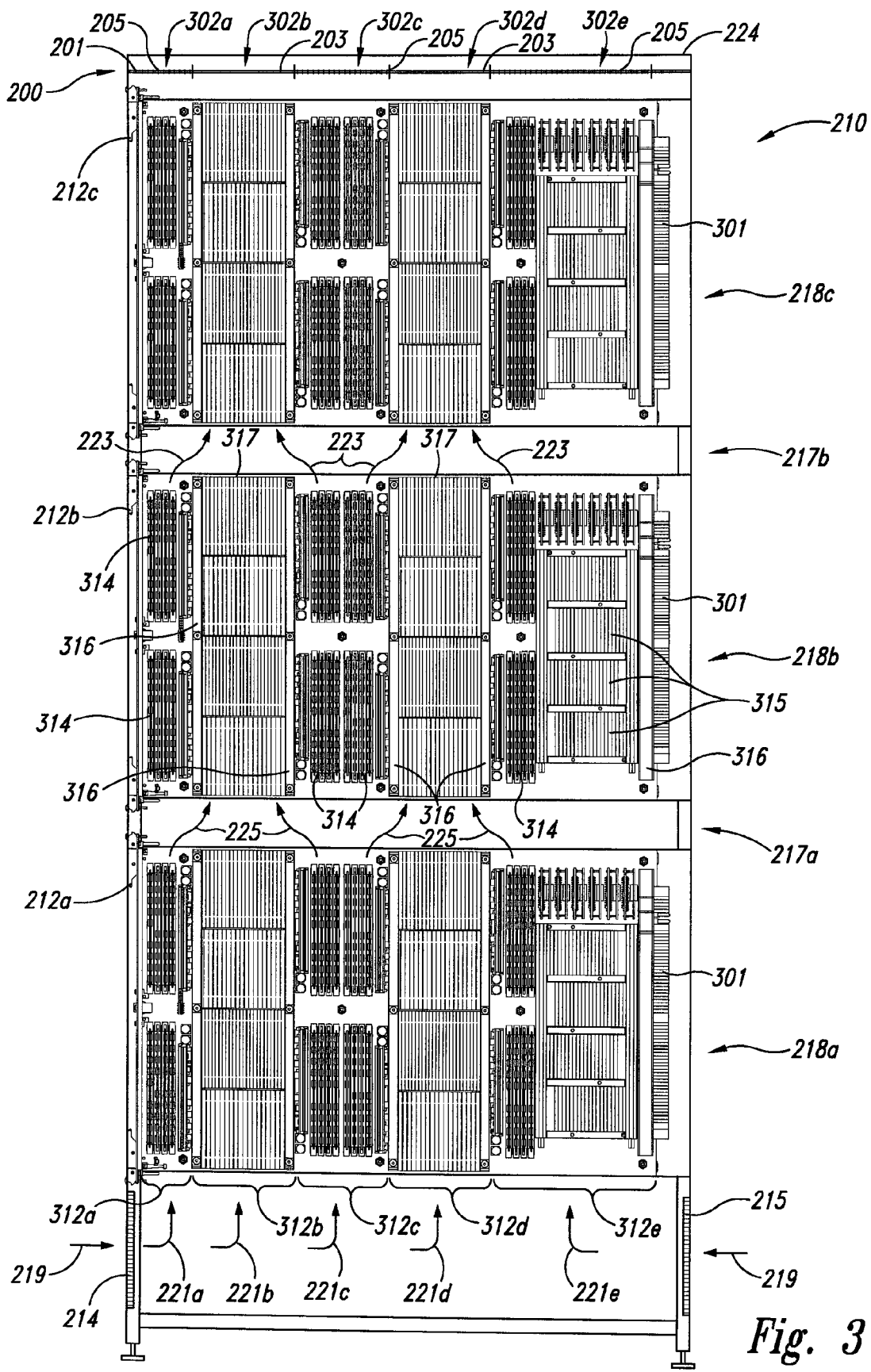
FIG. 3 is a side-elevation view of the computer cabinet and the airflow restrictor of FIG. 2.

FIG. 3 is a side-elevation view of the computer cabinet 210 with the airflow restrictor 200 of FIG. 2. The air mover assembly 202 has been removed from FIG. 3 for clarify. As shown in FIG. 3, the first, second, and third module compartments 218a-c can include first, second, and third computer modules 212a-c, respectively. While the computer modules 212a-c are shown in FIG. 3 as having generally similar configuration to one another, in other embodiments, at least one of the computer modules 212a-c can have a different configuration than the others.

The individual computer modules 212a-c can include a motherboard 301 with a plurality of dividers 316 that separate the computer modules 212a-c into discrete regions 312 (identified individually as first to fifth regions 312a-e, respectively). Each region 312 can hold various types of microelectronic devices. For example, in the illustrated embodiment, the motherboard 301 carries memory modules 314, network interface modules 315, and/or other suitable low-power microelectronic devices in the first, third, and fifth regions 312a, 312c, and 312e, respectively (hereinafter referred to as the "low-power regions"). The motherboard 301 also carries processors with cooling fins 317 and/or other high-power microelectronic devices in the second and fourth regions 312b and 312d, respectively (hereinafter referred to as the "high-power regions"). In other embodiments, the motherboard 301 can have the dividers 316 in other arrangements and/or can carry different microelectronic devices in at least one of the regions 312a-e.

The individual computer modules 212a-c can also include a plurality of shrouds (not shown) corresponding to one or more of the individual regions 312a-e. The shrouds and the dividers 316 together form discrete airflow passageways 302 (identified individually as first to fifth passageways 302a-e, respectively) generally corresponding to each of the regions 312. For example, the first, third, and fifth passageways 302a, 302c, and 302e (hereinafter referred to as "low-power passageways") generally correspond to the low-power regions. The second and fourth passageways 302b and 302d (hereinafter referred to as "high-power passageways") generally correspond to the high-power regions. In the illustrated embodiment, the passageways 302 of the computer modules 212a-c are generally aligned vertically in the computer cabinet 210. In other embodiments, the passageways 302 of individual computer modules 212a-c may be offset from one another or may be aligned in other directions.

In the illustrated embodiment, the airflow restrictor 200 is positioned adjacent to the third computer module 212c and the outlet 224. In this embodiment, the open portions 203 are generally aligned with the high-power passageways, and the restricted portions 205 are generally aligned with the low-power passageways. In other embodiments, other correspondence can be used, e.g., in certain embodiments, at least one of the open portions 203 can be generally aligned with at least one of the low-power passageways.

In operation, the air mover assembly 202 (FIG. 2) draws cooling air (represented by arrows 219) into the computer cabinet 210 and drives the cooling air upwardly toward the computer modules 212a-c. The cooling air flows through the computer modules 212a-c in a plurality of cooling air streams 221 (identified individually as first to fifth air streams 221a-e, respectively) via the passageways 302.

In the illustrated embodiment, the cooling air streams 221 flow through the first and second module compartments 218a-b and past the first and second computer modules 212a-b without restriction. As a result, the air streams 221 flow through each of the passageways 302 along paths of least resistance. For example, the low-power passageways typically have a lower flow resistance than the high-power passageways. As a result, the first, third, and fifth cooling air streams 221a, 221c, and 221e, respectively (hereinafter referred to as the "low-power air streams") flowing through the low-power passageways have higher flow rates than the second and fourth cooling air streams 221b and 221d, respectively (hereinafter referred to as the "high-power air streams") flowing through the high-power passageways.

As the cooling air flows through the third module compartment 218c, the airflow restrictor 200 can restrict the low-power air streams more than the high-power air streams. For example, as shown in FIG. 3, the open portions 203 of the airflow restrictor 200 allow the high-power air streams to directly exit the outlet 224, while the restricted portions 205 disrupt the flow of the low-power air streams exiting the computer cabinet 210. The disruption increases the flow resistance to the low-power air streams than the high-power air streams. In one embodiment, the restricted portions 205 create a pressure drop for at least one of the low-power air streams across the airflow restrictor 200. In other embodiments, the restricted portions 205 can otherwise limit the volume and/or modify other flow characteristics of the low-power air streams to increase the flow through the high-power streams.

Without being bound by theory, it is believed that the airflow restrictor 200 can thus increase flow rates of the high-power air streams past the computer modules 212 proximate to the outlet 224, while decreasing the flow rates of the adjacent low-power air streams. For example, as the low-power air streams leave the second module compartment 218b, the restricted portions 205 increase the pressure drop in the low-power air streams through the airflow restrictor 200 and force a portion of the cooling air to flow laterally (as indicated by arrows 223) through the second gap 217b into the high-power passageways. As a result, the high-power air streams have higher flow rates entering the third module compartment 218c than those entering the second module compartment 218b.

The increased flow rates in the high-power passageways can improve the temperature profile in the computer cabinet 210 without significantly increasing the pressure drop of the cooling air. As the cooling air flows through the module compartments 218, the temperature of the cooling air increases, and thus the heat capacitance of the cooling air decreases. As a result, the temperature of the third computer module 212c is higher than that of the first and second computer modules 212a-b. This temperature gradient requires a large amount of cooling air to adequately cool the third computer module 212c. However, the air mover 220 may not produce sufficient discharge pressure to force sufficient cooling air past the computer modules 212a-c. By restricting a portion of the cooling air exiting the computer cabinet 210 and allowing cross-mixing of cooling air between adjacent module compartments 218, as disclosed herein, however, the amount of cooling air supplied to the high-power passageways of the third computer module 212c can be increased without significantly increasing the pressure drop across the computer cabinet 210.

Furthermore, the airflow restrictor 200 can also force a portion of the cooling air to flow laterally (as indicated by arrows 225) through the first gap 217a into the high-power passageways of the second computer module 212b. As a result, the high-power air streams can have increasing flow rates as the cooling air flows from one module compartment 218 to the next. In addition, the airflow restrictor 200 can be selected or tailored so that a generally constant temperature can be achieved in the high-power microelectronic devices in the first, second, and third module compartments 218.

Even though the computer cabinet 210 is shown in FIG. 3 as having one airflow restrictor 200 positioned proximate to the outlet 224, in other embodiments, the computer cabinet 210 can also include airflow modifying devices (e.g., generally similar to or different from the airflow restrictor 200) between adjacent module compartments 218 and/or between the first module compartment 218a and the air mover assembly 202 (FIG. 2). Accordingly, the present invention is not limited to the particular embodiment illustrated in FIG. 3, but extends to other airflow modifying configurations as described herein.

Figure 4:
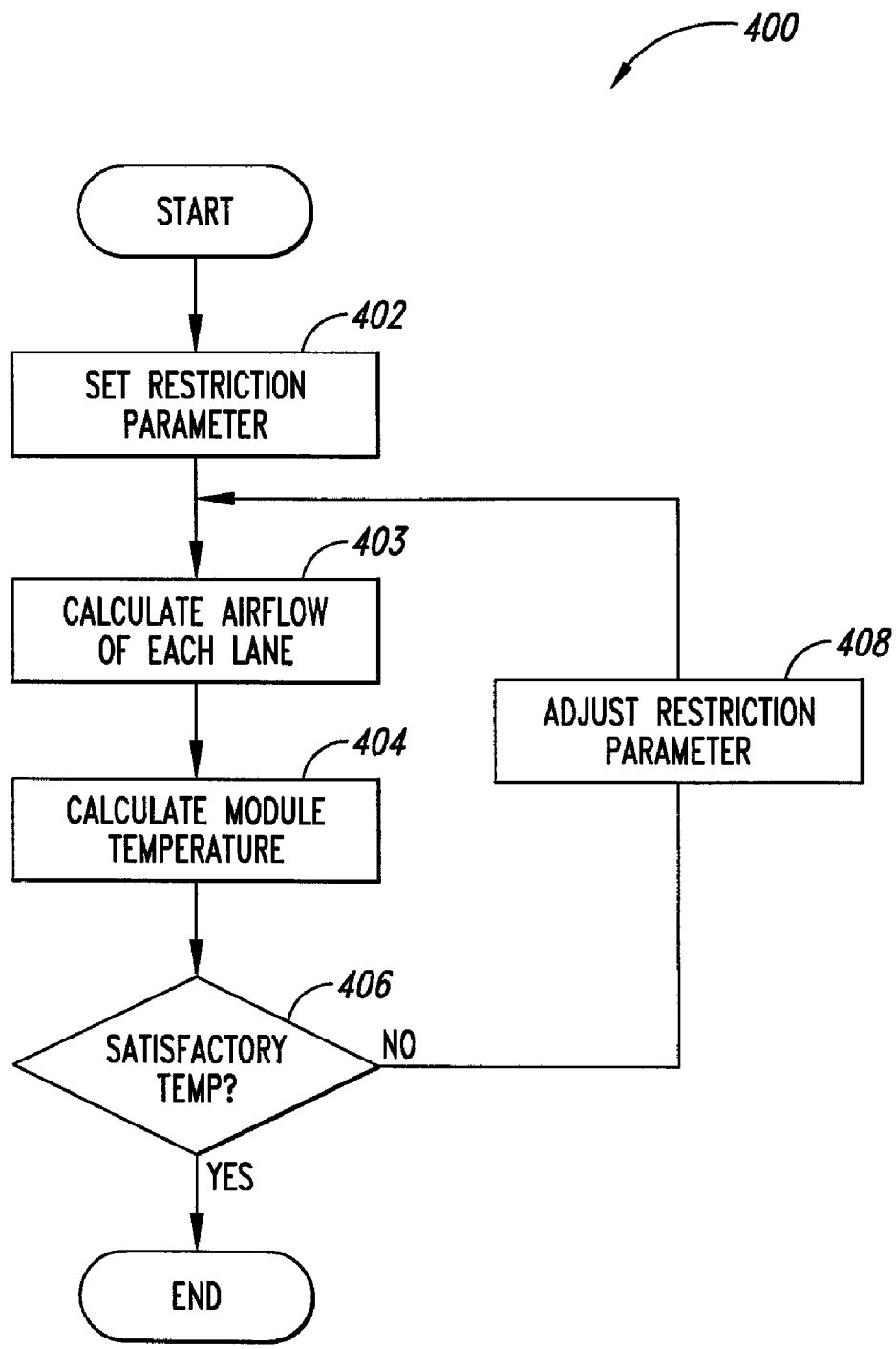
FIG. 4 is a flowchart illustrating a method of modifying a temperature profile in a computer cabinet configured in accordance with an embodiment of the invention.

FIG. 4 is a flowchart illustrating a method 400 of designing the airflow restrictor 200 in FIG. 2 in accordance with an embodiment of the invention. Even though the method is described below with reference to the computer cabinet 210 of FIG. 2, in other embodiments, the method 400 may be applied to the design of other airflow restrictor for other computer systems.

As shown in FIG. 4, an early stage 402 of the method 400 includes setting a restriction parameter for the airflow restrictor 200. In one embodiment, setting the restriction parameter includes setting a physical parameter of the restricted portions 205 (e.g., a number of apertures for the restricted portions 205, a size and/or shape of the apertures, a distribution of the apertures, and/or other characteristics of the apertures). In another embodiment, setting the restriction parameter includes setting an operational parameter of the restricted portions 205 (e.g., a desired pressure drop or flow rate across the airflow restrictor 200). In other embodiments, setting the restriction parameter can include setting a combination of the physical parameter and the operational parameter.

A subsequent stage 403 of the method 400 includes calculating flow rates for the cooling air streams 221 flowing through each passageway 302 (FIG. 3). The flow rates can be calculated iteratively by setting the pressure drop of the cooling air through each passageway equal to a pressure differential between a discharge pressure of the air mover 220 and the atmospheric pressure as follows:

$$\Delta P = \Delta P_1 + \Delta P_2 + \Delta P_3 + \Delta P_M$$

where $\Delta P$ is the total pressure drop, $\Delta P_1$, $\Delta P_2$, $\Delta P_3$ are pressure drops through the first to third module compartments 218a-c, respectively, and $\Delta P_M$ is the pressure drop across the airflow restrictor 200. The pressure drop of the cooling air across the computer modules 212 and the airflow restrictor 200 can be determined empirically, calculated based on a friction loss for a particular flow rate, e.g., based on a Reynolds number and a friction coefficient, or a combination of both.

Stage 404 of the method 400 includes calculating module temperatures for the computer modules 212. In one embodiment, the heat transfer from the computer modules 212 to the cooling air can be calculated based on a convention, conduction, radiation, or a combination of these heat transfer modes. In another embodiment, the module temperatures can be determined empirically.

At stage 406, a determination is made to decide whether the module temperatures provide a satisfactory temperature profile. For example, in one embodiment, if the module temperatures are generally equal to one another, the satisfactory temperature profile is indicated. In another embodiment, if the module temperatures vary within a threshold (e.g., 2° C.), the satisfactory temperature profile is indicated. In other embodiments, other suitable criteria may be used to indicate the satisfactory temperature profile.

If the satisfactory temperature profile is indicated, the process ends. Otherwise, the method 400 includes another stage 408 in which the restriction parameter is adjusted, and the process reverts to stage 403. In one embodiment, adjusting the restriction parameter can be based on the temperature profile. For example, if the temperature profile indicates that the module temperature in the third module compartment 218c is above a threshold, the pressure drop across the airflow restrictor 200 can be increased to force more cooling air into the high-power passageways. In other embodiments, adjusting the restriction parameter can be based on the total pressure drop in the computer cabinet 210 and/or other suitable parameters.

From the foregoing, it will be appreciated that specific embodiments of the invention have been described herein for purposes of illustration, but that various modifications may be made without deviating from the spirit and scope of the invention. For example, although elements of the invention described above have been presented in one or more arrangements, in other embodiments, other arrangements are possible depending on the particular situation. Further, while advantages associated with certain embodiments of the invention have been described in the context of those embodiments, other embodiments may also exhibit such advantages, and not all embodiments need necessarily exhibit such advantages to fall within the scope of the invention. Accordingly, the invention is not limited, except as by the appended claims.

I claim:

1. A computer system comprising:
   a plurality of computer modules, wherein each of the computer modules includes at least one divider that separates the corresponding computer module into a first region and a second region, the first region carrying a first group of one or more low-power microelectronic devices in a first airflow passageway, and the second region carrying a second group of one or more high-power microelectronic devices in a second airflow passageway;
   a computer cabinet holding the plurality of computer modules, the computer cabinet including an air inlet and an air outlet;
   an air mover carried by the computer cabinet, the air mover being configured to move a flow of cooling air from the air inlet, past the plurality of computer modules via the first and second airflow passageways, and out the computer cabinet via the air outlet; and
   an airflow restrictor carried by the computer cabinet and positioned proximate to the air outlet, wherein the airflow restrictor is configured to restrict the flow of cooling air through the first airflow passageway of the computer cabinet to achieve a desired temperature profile in the computer cabinet.

2. The computer system of claim 1 wherein the airflow restrictor is configured to restrict the flow of cooling air through the first airflow passageway without disrupting the flow of cooling air through the second airflow passageway.

3. The computer system of claim 1 wherein the airflow restrictor is configured to create a pressure drop for a first portion of the cooling air flowing through the first airflow passageway while allowing a second portion of the cooling air flowing through the second airflow passageway to exit the air outlet without restriction.

4. The computer system of claim 1 wherein the airflow restrictor includes an open portion corresponding to the first airflow passageway and a restricted portion corresponding to the second airflow passageway.

5. The computer system of claim 1 wherein the airflow restrictor includes an opening corresponding to the first airflow passageway and an array of through holes corresponding to the second airflow passageway.

6. A computer system comprising:
   a plurality of computer modules;
   a computer cabinet holding the plurality of computer modules, the computer cabinet including an air inlet and an air outlet;
   an air mover carried by the computer cabinet, the air mover being configured to move a flow of cooling air from the air inlet, past the plurality of computer modules, and out the computer cabinet via the air outlet; and
   an airflow restrictor carried by the computer cabinet and positioned proximate to the air outlet, wherein the airflow restrictor is configured to restrict the flow of cooling air through a portion of the computer cabinet to achieve a desired temperature profile in the computer cabinet, wherein the individual computer modules individually define a first airflow passageway spaced apart from a second airflow passageway, and wherein adjacent module compartments are spaced apart by a gap, and wherein the airflow restrictor is configured to direct a portion of the cooling air through the gap from the first airflow passageway to the second airflow passageway.

7. A computer system comprising:
   a computer cabinet having a first module compartment proximate to an air inlet and a second module compartment proximate to an air outlet;
   a first computer module positioned in the first module compartment, wherein the first computer module includes at least a first divider that separates the first computer module into a first high-power region and a first low-power region;
   a second computer module positioned in the second module compartment, wherein the second computer module includes at least a second divider that separates the second computer module into a second high-power region and a second low-power region, wherein the first and second high-power regions are aligned to define a first airflow passageway and the first and second low-power regions are aligned to define a second airflow passageway spaced apart from the first airflow passageway;
   an air mover positioned inside the computer cabinet and configured to move a flow of cooling air from the air inlet, through the first and second airflow passageways, and out the computer cabinet via the air outlet; and
   an airflow restrictor carried by the computer cabinet, the airflow restrictor including an open portion in flow communication with the first airflow passageway and a restricted portion in flow communication with the second airflow passageway.

8. The computer system of claim 7 wherein the airflow restrictor includes a plate a plurality of apertures.

9. The computer system of claim 7 wherein the airflow restrictor includes a plate having a perforated portion.

10. The computer system of claim 7 wherein the airflow restrictor is positioned between the air outlet and the second module compartment.

11. A method for cooling a plurality of computer modules carried by a computer cabinet in a room, the computer cabinet including an air inlet and an air outlet, the method comprising:
- separating a first computer module from a second computer module by a gap;
- driving a flow of cooling air from the air inlet past the first computer module, the flow of cooling air including a first air stream at least partially spaced apart from a second air stream;
- selectively altering the first air stream and the second air stream by directing a portion of the first air stream through the gap and into the second air stream to effect a desired temperature profile of the computer modules in the computer cabinet; and
- driving the altered first and second air streams past a second computer module and into the room through the air outlet.

12. The method of claim 11 wherein selectively altering includes restricting the flow of the first air stream out of the air outlet more than the flow of the second air stream out of the air outlet.

13. The method of claim 11 wherein selectively altering includes creating a greater pressure drop for the first air stream than the second air stream.

14. A system for cooling a plurality of computer modules carried by a computer cabinet in a room, the computer cabinet including an air inlet and an air outlet, the system comprising:
- means for separating a first computer module from a second computer module by a gap;
- means for driving a flow of cooling air from the air inlet past the first computer module, the flow of cooling air including a first air stream at least partially spaced apart from a second air stream;
- means for selectively altering the first air stream and the second air stream by directing a portion of the first air stream through the gap and into the second air stream to effect a desired temperature profile of the computer modules in the computer cabinet; and
- means for driving the altered first and second air streams past a second computer module and into the room through the air outlet.

15. The system of claim 14 wherein the means for selectively altering include means for restricting the flow of the first air stream out of the air outlet more than the flow of the second air stream out of the air outlet.

16. The system of claim 14 wherein the means for selectively altering include means for creating a greater pressure drop for the first air stream than the second air stream.

* * * * *

UNITED STATES PATENT AND TRADEMARK OFFICE
CERTIFICATE OF CORRECTION

| | | |
|---|---|---|
| PATENT NO. | : 7,898,799 B2 | Page 1 of 1 |
| APPLICATION NO. | : 12/060377 | |
| DATED | : March 1, 2011 | |
| INVENTOR(S) | : Wade J. Doll | |

It is certified that error appears in the above-identified patent and that said Letters Patent is hereby corrected as shown below:

In column 8, line 62, in Claim 8, after "plate" insert -- having --.

Signed and Sealed this
Tenth Day of May, 2011

David J. Kappos
*Director of the United States Patent and Trademark Office*